US011935711B2

(12) United States Patent
Shimoyama

(10) Patent No.: US 11,935,711 B2
(45) Date of Patent: Mar. 19, 2024

(54) SEESAW SWITCH AND ELECTRONIC APPARATUS

(71) Applicant: JVCKENWOOD Corporation, Yokohama (JP)

(72) Inventor: Takeshi Shimoyama, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 201 days.

(21) Appl. No.: 17/476,520

(22) Filed: Sep. 16, 2021

(65) Prior Publication Data

US 2022/0005656 A1 Jan. 6, 2022

Related U.S. Application Data

(63) Continuation of application No. PCT/JP2019/041265, filed on Oct. 21, 2019.

(30) Foreign Application Priority Data

Mar. 25, 2019 (JP) ................................ 2019-057482
Mar. 25, 2019 (JP) ................................ 2019-057484

(51) Int. Cl.
*H05K 5/00* (2006.01)
*H01H 23/16* (2006.01)
*H01H 23/24* (2006.01)

(52) U.S. Cl.
CPC ............ *H01H 23/16* (2013.01); *H01H 23/24* (2013.01); *H05K 5/0017* (2013.01)

(58) Field of Classification Search
CPC .... H05K 5/0017; H05K 5/0217; H01H 23/16; H01H 23/24

(Continued)

(56) References Cited

U.S. PATENT DOCUMENTS 6,769,603 B2 * 8/2004 Nagai ...................... G11C 7/16 235/375
2008/0230360 A1 * 9/2008 Wada ..................... H01H 23/30 200/339
2021/0407747 A1 * 12/2021 Shimoyama ......... H05K 5/0017

FOREIGN PATENT DOCUMENTS

CN 108766822 * 11/2018 ............ H01H 23/08
JP 62-152329 9/1987

(Continued)

OTHER PUBLICATIONS

International Search Report and Written Opinion for International Application No. PCT/JP2019/041265 dated Dec. 24, 2019, 7 pages.

*Primary Examiner* — Hung S. Bui
(74) *Attorney, Agent, or Firm* — Amin, Turocy & Watson, LLP

(57) ABSTRACT

A seesaw switch includes a rocker configured to rock by a press operation; a first fulcrum located at least at one end portion in a longitudinal direction of the rocker; a second fulcrum located between the one end portion and another end portion opposite to the one end portion in the longitudinal direction of the rocker; and a main switch disposed on the another end portion opposite to the one end portion at which the first fulcrum is located in the rocker and configured to have contact with the rocker due to rock of the rocker by the press operation, wherein a fulcrum of the rocker is switched between the first fulcrum and the second fulcrum in accordance with an amount of the press operation to the another end portion opposite to the one end portion at which the first fulcrum is located in the longitudinal direction of the rocker.

8 Claims, 5 Drawing Sheets

(58) Field of Classification Search
USPC .......................................................... 361/807
See application file for complete search history.

(56) References Cited

FOREIGN PATENT DOCUMENTS

| | | | |
|---|---|---|---|
| JP | 06-026131 | 4/1994 | |
| JP | 10-125179 | * 10/1998 | ............. H01H 23/30 |
| JP | 2001-167672 | 6/2001 | |
| JP | 2001-256862 | * 9/2001 | ............. H01H 23/30 |
| JP | 2010-165608 | 7/2010 | |
| JP | 2011-222305 | 11/2011 | |
| WO | 2010/086998 | 8/2010 | |

* cited by examiner

A-A SECTION

B-B SECTION (FRONT SIDE)

(BACK SIDE)

B-B SECTION (FRONT SIDE)

SEESAW SWITCH AND ELECTRONIC APPARATUS

CROSS-REFERENCE TO RELATED APPLICATIONS

This application is a Continuation of PCT International Application No. PCT/JP2019/041265 filed on Oct. 21, 2019 which claims the benefit of priority from Japanese Patent Application No. 2019-057482 filed on Mar. 25, 2019 and Japanese Patent Application No. 2019-057484 filed on Mar. 25, 2019, the entire contents of all of which are incorporated herein by reference.

FIELD

The present application relates to a seesaw switch and an electronic apparatus.

BACKGROUND

Among buttons each to be pressed by a user for an input operation, a button that varies in operation in accordance with pressed positions of a switch to enable two types of input operations with the one switch is known. For example, Japanese Unexamined Utility Model Application Publication No. S62-152329 U and Japanese Unexamined Utility Model Application Publication No. H6-26131 U each disclose a so-called seesaw switch enabling rock with, as the fulcrum, either end portion in a longitudinal direction of a button. The seesaw switches disclosed in Japanese Unexamined Utility Model Application Publication No. S62-152329 U and Japanese Unexamined Utility Model Application Publication No. H6-26131 U each enable rock, in response to a press on one end side in the longitudinal direction, with the other end side as the fulcrum, and each enable rock, in response to a press on the other end side, with the one end side as the fulcrum. Such a seesaw switch as above changes in rock manner in accordance with the pressed positions, so that two types of input operations can be achieved with one switch.

SUMMARY

A seesaw switch includes an operation unit that receives an input operation to the seesaw switch and rocks at a time of the input operation and tactile switches that detect the input operation in response to contact with the operation unit at the time of the input operation to the operation unit. Such tactile switches are disposed, below the operation unit, at two places near both ends in the longitudinal direction of the seesaw switch. In each of the seesaw switches disclosed in Japanese Unexamined Utility Model Application Publication No. S62-152329 U and Japanese Unexamined Utility Model Application Publication No. H6-26131 U, in a case where an input operation is made at a position near one end portion in the longitudinal direction of the operation unit, the operation unit rocks with a vicinity of an opposite end portion as the fulcrum, so that the input operation is detected by the tactile switch located on the side on which the input operation is made.

However, at the time of the input operation to the seesaw switch, in a case where the operation unit rocks with, as the fulcrum, the vicinity of the end portion in the longitudinal direction of the operation unit, the operation unit approaches not only the tactile switch on the side on which the input operation is made but also the tactile switch on the fulcrum side. Thus, in order to inhibit, at the time of the input operation to the seesaw switch, the operation unit from having contact with the tactile switch different from the tactile switch corresponding to the input operation, a highly accurate clearance between the operation unit and the tactile switches is required. In this case, a high accuracy is required for manufacturing the seesaw switch.

Meanwhile, like the fulcrum of the seesaw switch in the related art in Japanese Unexamined Utility Model Application Publication No. S62-152329 U, in a case where the operation unit rocks with the fulcrum provided near a center in the longitudinal direction of the seesaw switch, the operation unit rocks such that the opposite end portion to the end portion on the side on which the input operation is made moves away from the tactile switch. Thus, no high accuracy is required for the clearance between the operation unit and the tactile switches, and the manufacturing thereof becomes easy. However, the operation unit rocks greatly at the time of the input operation. Thus, for example, due to an increase in a gap between the operation unit and the peripheral member of the seesaw switch or a rise of the opposite end portion to the end portion on the side on which the input operation is made, an appearance thereof is likely to be unattractive. Therefore, it is really difficult for a seesaw switch to satisfy both securement of a beautiful appearance and easiness for manufacturing.

A seesaw switch enables two types of the input operations based on the pressed positions of the switch. In recent years, many types of apparatuses equipped with seesaw switches are multifunctional. Thus, the types of the input operations tend to be increasing. Meanwhile, an increase in the number of members, such as seesaw switches and buttons, for many types of the input operations tends to cause the input operations complicated. Thus, members for the input operations with which a multifunctional apparatus is equipped have room for further improvement in operability.

A seesaw switch and an electronic apparatus are disclosed.

According to one aspect, there is provided a seesaw switch comprising: a rocker configured to rock by a press operation; a first fulcrum located at least at one end portion in a longitudinal direction of the rocker; a second fulcrum located between the one end portion and another end portion opposite to the one end portion in the longitudinal direction of the rocker; and a main switch disposed on the another end portion opposite to the one end portion at which the first fulcrum is located in the rocker and configured to have contact with the rocker due to rock of the rocker by the press operation, wherein a fulcrum of the rocker in the rock is switched between the first fulcrum and the second fulcrum in accordance with an amount of the press operation to the another end portion opposite to the one end portion at which the first fulcrum is located in the longitudinal direction of the rocker.

According to one aspect, there is provided an electronic apparatus comprising: a display panel with a display screen on a front face thereof; a front panel surrounding a circumference of the display panel; and the seesaw switch described above which is surrounded by the front panel.

The above and other objects, features, advantages and technical and industrial significance of this application will be better understood by reading the following detailed description of presently preferred embodiments of the application, when considered in connection with the accompanying drawings.

DETAILED DESCRIPTION OF THE PREFERRED EMBODIMENTS

Embodiments of a seesaw switch and an electronic apparatus according to the present application will be described in detail below based on the drawings. Note that the present application is not limited to the embodiments. The constituent elements in the following embodiments include constituent elements replaceable and constituent elements conceivable with ease by those skilled in the art and substantially the same constituent elements.

First Embodiment

Figure 1:
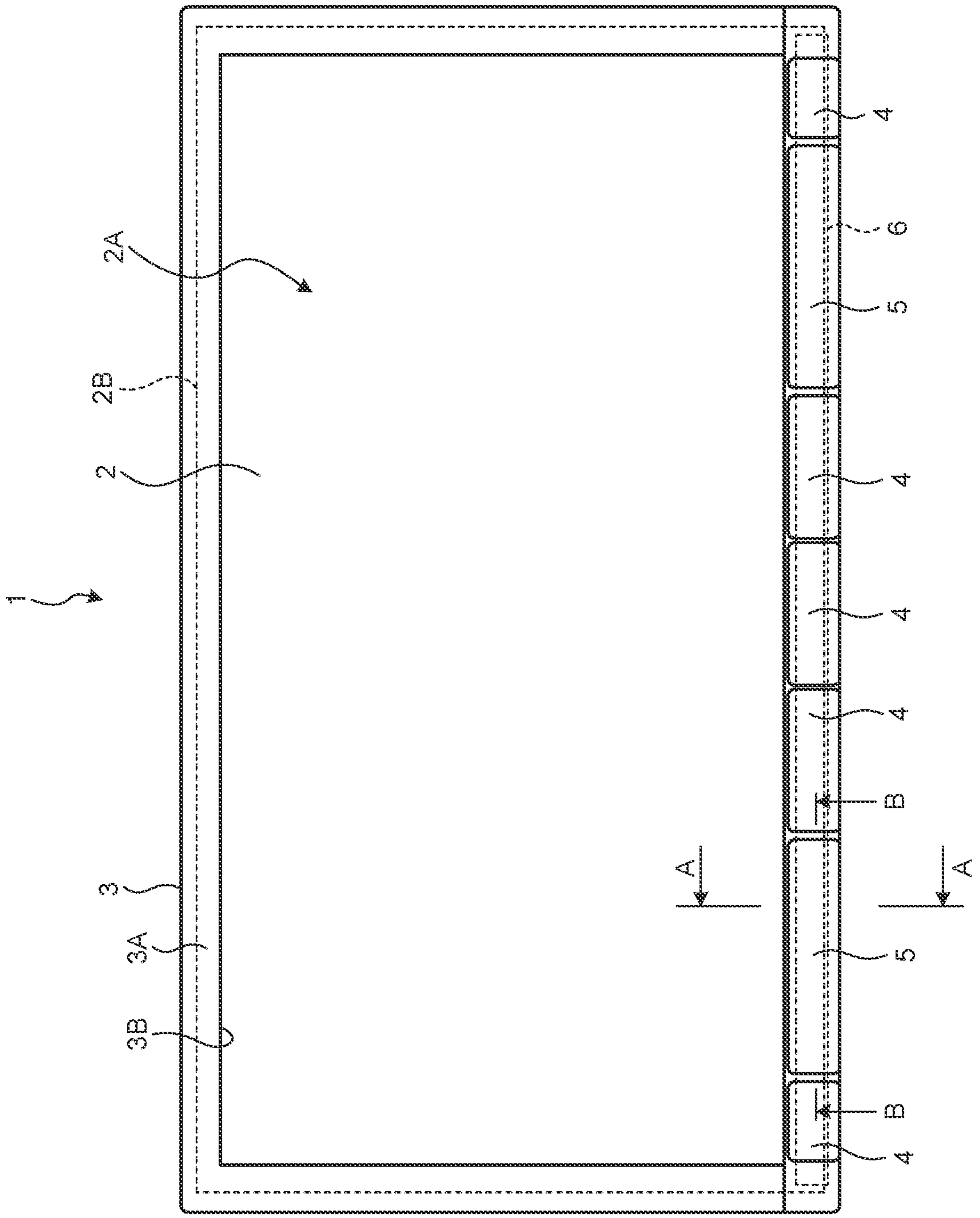
FIG. 1 is a front view of an electronic apparatus according to a first embodiment.
Figure 2:
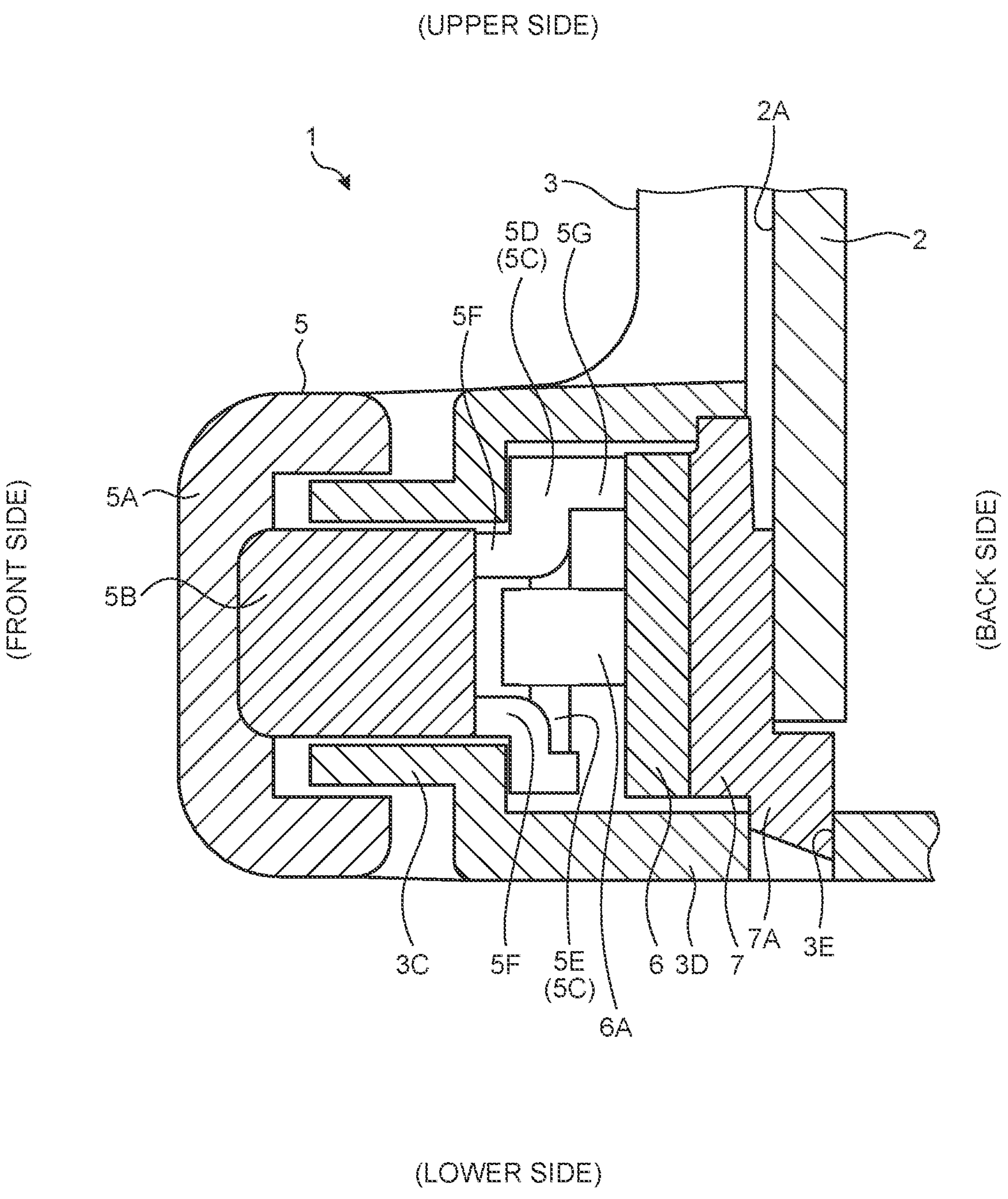
FIG. 2 is a sectional view taken along line A-A of FIG. 1.

FIG. 1 is a front view of an electronic apparatus 1 according to a first embodiment. FIG. 2 is a sectional view taken along line A-A of FIG. 1. As illustrated in FIGS. 1 and 2, the electronic apparatus 1 according to the first embodiment serves, for example, as an audio-visual (AV) integrated car navigation apparatus which is equipped inside a vehicle. The electronic apparatus 1 includes a display panel 2, a front panel 3, buttons 4, seesaw switches 5, a substrate 6, and a holder 7.

Note that, in the following description, an upper side of the electronic apparatus 1 in normal use is defined as an upper side of the electronic apparatus 1, and a lower side of the electronic apparatus 1 in normal use is defined as a lower side of the electronic apparatus 1. In addition, in the following description, a left-and-right direction in a case where the electronic apparatus 1 is viewed from a side of the front panel 3 is defined as a left-and-right direction of the electronic apparatus 1.

The display panel 2 has a rectangular shape and has a display screen 2A on its front. The front is a face to be viewed by an operator. Since the car navigation apparatus is disposed in front inside the vehicle, the front is oriented backward inside the vehicle. The display screen 2A has a rectangular shape smaller than the rectangular shape of the display panel 2, and is disposed inside an outer edge 2B of the display panel 2. In the first embodiment, the display screen 2A of the display panel 2 is a pressure-sensitive touch panel.

The front panel 3 has a rectangular shape and surrounds a circumference of the display panel 2. The front panel 3 includes a frame 3A that has a rectangular shape and surrounds the circumference of the display panel 2, and a window 3B that has a rectangular shape and exposes the display screen 2A of the display panel 2 inside the frame 3A.

As illustrated in FIG. 1, multiple buttons 4 and multiple seesaw switches 5 are disposed side by side in the left-and-right direction on the front side of the front panel 3 and on the lower side of the front panel 3. Each of the buttons 4 is an input member enabling a predetermined input operation by a press, and each of the seesaw switches 5 is an input member enabling different input operations in accordance with pressed positions. The buttons 4 and the seesaw switches 5 are substantially the same in width in the up-and-down direction. The seesaw switch 5 is longer in length in the left-and-right direction than the button 4. Thus, each of the seesaw switches 5 enables different input operations according to a press at a position closer to one side in the left-and-right direction and a press at a position closer to the other side. The multiple buttons 4 and the multiple seesaw switches 5 formed as above are disposed side by side in the left-and-right direction.

As illustrated in FIG. 2, the seesaw switch 5 includes a key 5A, a rocker 5B, and a hinge 5C. The key 5A is exposed outward on the front side of the front panel 3 and receives a press operation from the operator. The rocker 5B is disposed on a back side of the key 5A, and the hinge 5C is connected integrally to the back side thereof. The rocker 5B and the hinge 5C are formed of resin material. For elastic deformation, the hinge 5C has a rod shape or a tabular shape and curves or bends. Therefore, when the key 5A is pressed toward the back side by the operator, the key 5A and the rocker 5B rock due to deformation of the hinge 5C, so that a vicinity of the pressed position can move toward the back side. Each of positions near both ends in the left-and-right direction corresponds to a position for a press for the input operation to the seesaw switch 5. When no operation is made to the key 5A by the operator, due to the elasticity of the hinge 5C, the rocker 5B together with the key 5A is energized toward a position to the front side.

Note that, as illustrated in FIG. 2, the front panel 3 has a guider 3C surrounding the top, bottom, left, and right of the rocker 5B, so that the guider 3C guides a movement of the rocker 5B. The key 5A covers the front side of the guider 3C without hindering the movement of the rocker 5B.

The substrate 6 is disposed along the front of the display panel 2 at the lower portion of the display panel 2. In the first embodiment, the substrate 6 ranges continuously in the left-and-left direction. As illustrated in FIG. 2, the substrate 6 has a main switch 6A as a tactile switch implemented on the front thereof. Regarding the main switch 6A, two main switches 6A are disposed in one seesaw switch 5 (see FIG. 4). Each of the main switch 6A faces to the back side of the rocker 5B in the seesaw switch 5. Therefore, when the key 5A is pressed to the back side by the operator, the key 5A and the rocker 5B rock together due to the deformation of the hinge 5C, and the vicinity of the pressed position of the key 5A and the rocker 5B moves toward the back side, so that the main switch 6A operates. The substrate 6 is housed in the front panel 3. Specifically, the front panel 3 has a case 3D that extends backward from the guider 3C described above for surrounding a top, bottom, left, and right of the substrate. The substrate 6 is housed in the case 3D.

As illustrated in FIG. 2, the holder 7 is interposed between the front of the display panel 2 and the back of the substrate 6, at the lower portion of the display panel 2. The holder 7 has a tabular shape and occludes the back side of the case 3D of the front panel 3 in which the substrate 6 is housed, and is attached to the front panel 3. Specifically, the holder 7 has a projection 7A which is inserted into a through hole 3E at the bottom of the front panel 3, and is attached to the front panel 3 due to fitting of the projection 7A to the through hole 3E.

The holder 7 attached to the front panel 3 abuts on a back of the substrate 6. As described above, when the key 5A is pressed toward the back side by the operator, the key 5A and the rocker 5B rock due to the deformation of the hinge 5C. Then, the vicinity of the pressed position moves toward the back side, so that the main switch 6A on the substrate 6 operates. In this case, since the holder 7 abuts on the back of the substrate 6, a reaction force occurs against a pressing force on the substrate toward the back side.

Figure 3:
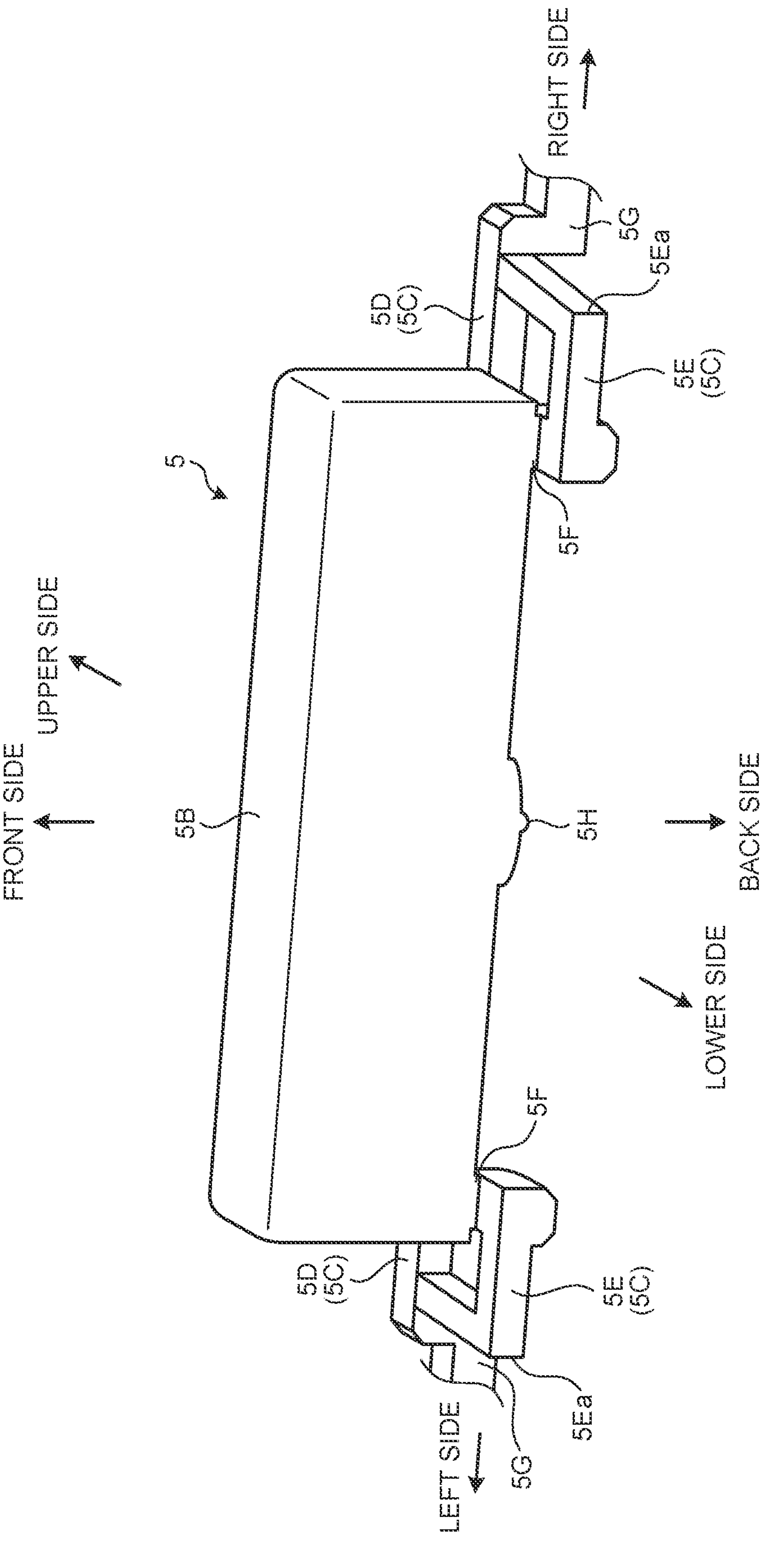
FIG. 3 is a perspective view of a rocker and a hinge illustrated in FIG. 2.
Figure 4:
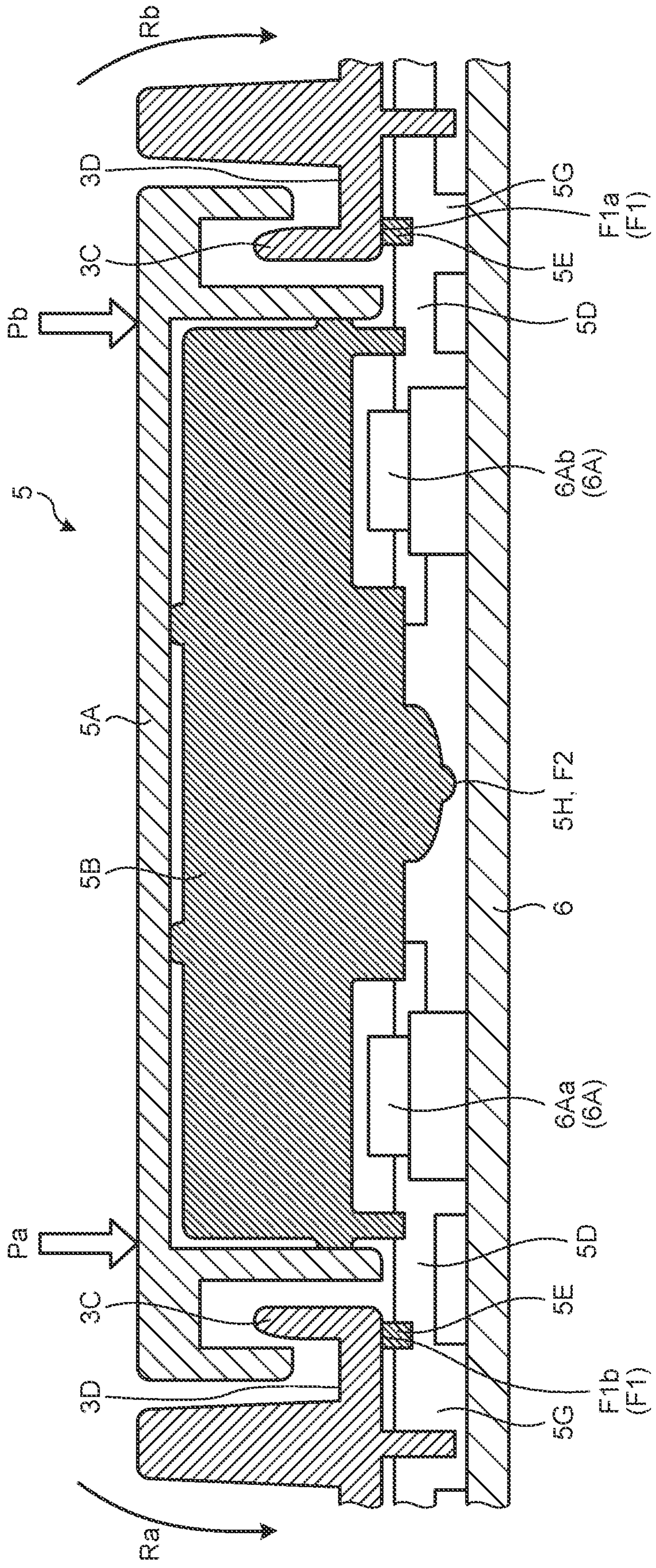
FIG. 4 is a sectional view taken along line B-B of FIG. 1.

Next, a rocker 5B and a hinge 5C in a seesaw switch 5 will be described. FIG. 3 is a perspective view of the rocker 5B and the hinge 5C illustrated in FIG. 2. FIG. 4 is a sectional view taken along line B-B of FIG. 1. Note that FIG. 3 illustrates the rocker 5B without the key 5A. The seesaw switch 5 is disposed on the front side of the substrate 6 which is an arrangement member for arrangement of the seesaw switch 5, and includes the key 5A, the rocker 5B, the hinge 5C, and a connection 5G.

As described above, the rocker 5B is disposed on the back side of the key 5A in the seesaw switch 5. When the key 5A is pressed toward the back side by the operator, the rocker 5B causes the main switch 6A to operate. That is, the rocker 5B is provided so as to rock by a press operation to the seesaw switch 5, so that a relative positional relationship between the rocker 5B and the substrate 6 can change. Thus, when the key 5A is pressed toward the back side by the operator, the vicinity of the pressed position of the rocker 5B comes close to the substrate 6 and then the rocker 5B has contact with the main switch 6A disposed on the substrate 6, so that the main switch 6A can operate. The rocker 5B is provided, for example, as a block having a substantially rectangular parallelepiped shape, and is formed of resin material. The rocker 5B is disposed such that the longitudinal direction of the rectangular parallelepiped corresponds to the left-and-right direction of the electronic apparatus 1, the lateral direction thereof corresponds to the up-and-down direction of the electronic apparatus 1, and the height direction thereof corresponds to the front-and-back direction of the electronic apparatus 1.

The rocker 5B has a protrusion 5H protruding toward the back side at a position near a center in the longitudinal direction of the rocker 5B on a face on the back side. The protrusion 5H protrudes greatly toward the back side in comparison to portions of the rocker 5B excluding the protrusion 5H on a face of the back side. For example, the protrusion 5H with a constant height is formed in a lateral direction of the rocker 5B.

As described above, the hinge 5C is formed of resin material and is connected integrally to the rocker 5B. Due to its elastic deformation, the hinge 5C supports the rocker 5B rockably. The rocker 5B is provided with arms 5F extending toward the back side, at four places in the upper left, upper right, lower left, and lower right on the back side. The four arms 5F are disposed one-to-one near the four corners on the back side of the rocker 5B. The hinge 5C is connected to the arms 5F as above and thus is coupled to the rocker 5B through the arms 5F. The hinge 5C includes a first hinge 5D and a second hinge 5E. Two first hinges 5D and two second hinges 5E are provided to one rocker 5B. Each of the first hinges 5D and the second hinges 5E has a square-bar shape and has an end portion coupled to the corresponding arm 5F. A pair of the first hinge 5D and the second hinge 5E is disposed on each side of the rocker 5B in the longitudinal direction.

Each of the first hinges 5D disposed on both end sides of the rocker 5B in the longitudinal direction is coupled to the rocker 5B on the same side in the lateral direction of the rocker 5B. Particularly, each of the two first hinges 5D has one end coupled to one of the two arms 5F located closer to the upper side of the rocker 5B in the up-and-down direction of the electronic apparatus 1 among the four arms 5F provided at the rocker 5B. Each of the two first hinges 5D extends from the arm 5F in the direction opposite to the side on which the other first hinge 5D is located in the longitudinal direction of the rocker 5B. That is, the two first hinges 5D coupled to the one rocker 5B are coupled at positions closer to the upper side of the electronic apparatus 1 in the lateral direction of the rocker 5B, near the end portions different in the longitudinal direction of the rocker 5B, and extend in the longitudinal direction of the rocker 5B. Each of the first hinges 5D coupled to the rocker 5B through the arm 5F as above has a flexibility and is capable of bending with the end portion on the side of coupling to the rocker 5B as the fulcrum.

Each of the second hinges 5E disposed on the end sides in the longitudinal direction of the rocker 5B is coupled to the rocker 5B on the opposite side to the side of coupling of the first hinge 5D in the lateral direction of the rocker 5B. Particularly, each of the two second hinges 5E coupled to the rocker 5B has one end coupled to one of the two arms 5F located closer to the lower side of the rocker 5B in the up-and-down direction of the electronic apparatus 1 among the four arms 5F provided at the rocker 5B (refer to FIG. 3). The other end of each of the second hinges 5E is coupled to the first hinge 5D at a position on the side of coupling of the first hinge 5D in the rocker 5B, that is, at a position on the upper side of the electronic apparatus 1 in the lateral direction of the rocker 5B.

Particularly, each of the second hinges 5E extends from the position of coupling to the arm 5F in the direction opposite to the side on which the other second hinge 5E is located in the longitudinal direction of the rocker 5B, and bends, at a predetermined position, in the direction to the location of the first hinge 5D in the lateral direction of the rocker 5B. That is, each of the second hinges 5E has a bent portion 5Ea and bends at an angle of approximately 90 degrees at the bent portion 5Ea. Thus, each of the second hinge 5E has a portion extending in the longitudinal direction of the rocker 5B between the end portion on the side of coupling to the arm 5F and the bent portion 5Ea, and a portion extending in the lateral direction of the rocker 5B between the end portion on the side of coupling to the first hinge 5D and the bent portion 5Ea. In this case, the portion between the end portion on the side of coupling to the arm 5F and the bent portion 5Ea in each of the second hinges 5E is located closer to the front side than the first hinge 5D is. Thus, the portion between the end portion on the side of coupling to the first hinge 5D and the bent portion 5Ea in each of the second hinges 5E slants in the direction from the front side to the back side, from the side on which the bent portion 5Ea is located to the side on which the first hinge 5D is located.

Similarly to the first hinges 5D, each of the second hinges 5E has a flexibility and is capable of bending with the end portion on the side of coupling to the rocker 5B as the fulcrum through the arm 5F. Thus, each of the first hinges 5D and each of the second hinges 5E located on the same side in the longitudinal direction of the rocker 5B and coupled together with one end portion of the second hinge 5E being coupled with one end portion of the first hinge 5D can be bent together. That is, the hinge 5C including the first hinge 5D and the second hinge 5E can be bent with the first hinge 5D and the second hinge 5E being bent together.

The connection 5G is coupled to an opposite end portion to the end portion coupled to the rocker 5B through the arm 5F in the first hinge 5D, and is provided on an extension line of the first hinge 5D extending in the longitudinal direction of the rocker 5B. That is, the first hinge 5D having one end coupled to the rocker 5B has the other end coupled to the connection 5G. When viewed in the up-and-down direction of the electronic apparatus 1, that is, when viewed in the lateral direction of the rocker 5B, the connection 5G protrudes toward the back side of the electronic apparatus 1. As above, the connection 5G in the seesaw switch 5 coupled to the first hinge 5D is a portion which is in contact with the substrate 6 which is an arrangement member for arrangement of the seesaw switch 5. In the connection 5G, a face of a tip side protruding toward the back side of the electronic apparatus 1 is in contact with the substrate 6.

In the multiple seesaw switches 5 disposed on the front side of the substrate 6, the sides on which the first hinges 5D are coupled to the rockers 5B are located on the same side in the lateral direction of the rocker 5B. Also in the multiple seesaw switches 5 disposed on the front side of the substrate 6, the sides on which the second hinges 5E are coupled to the rockers 5B are located on the other same side in the lateral direction of the rocker 5B. In the first embodiment, each of the seesaw switches 5 in the multiple seesaw switches 5 has the first hinges 5D coupled to the rocker 5B on the upper side of the electronic apparatus 1 in the lateral direction of the rocker 5B and the second hinges 5E coupled to the rocker 5B on the lower side of the electronic apparatus 1 in the lateral direction of the rocker 5B.

The rocker 5B, hinges 5C, arms 5F, and connections 5G as above are integrally formed by, for example, molding with resin material.

The rocker 5B is arranged such that the connection 5G coupled to the first hinges 5D is in contact with the front side of the substrate 6. With the connection 5G in contact with the substrate 6, the second hinge 5E coupled to the rocker 5B and the first hinge 5D is located on the back side of the case 3D housing the substrate 6 in the front panel 3 and is in contact with the case 3D from the back side. Particularly, the portion of the second hinge 5E between the end portion coupled to the first hinge 5D and the bent portion 5Ea is in contact with the case 3D from the back side of the case 3D. Each of the second hinges 5E located on both sides in the longitudinal direction of the rocker 5B is in contact with the case 3D from the back side of the case 3D.

Meanwhile, the protrusion 5H of the rocker 5B is spaced apart from the substrate 6 in a state in which no press operation is made to the seesaw switch 5 and the connection 5G is in contact with the substrate 6. That is, since the protrusion 5H is provided on the back side of the rocker 5B, the protrusion 5H faces to the substrate 6 with the connection 5G being in contact with the substrate 6, and is spaced apart from the substrate 6 in a state in which no press operation is made to the seesaw switch 5.

The two main switches 6A implemented on the substrate 6 and disposed to the one seesaw switch 5 are disposed at positions on both sides of the protrusion 5H in the longitudinal direction of the rocker 5B. That is, the two main switches 6A are implemented on the substrate 6 at positions on both sides of the protrusion 5H in the longitudinal direction of the rocker 5B, and face to the rocker 5B. The main switches 6A are spaced apart from the rocker 5B in a state in which no press operation is made to the seesaw switch 5.

The function of the seesaw switch 5 and the electronic apparatus 1 according to the first embodiment with the above configuration will be described below. At the time of an input operation to the seesaw switch 5, the operator makes a press operation to the key 5A of the seesaw switch 5, for example, with a finger. Specifically, a press operation is made at a position near an end portion in the longitudinal direction of the seesaw switch 5.

Note that, since the seesaw switch 5 enables, to the electronic apparatus 1, different functions with a press operation at a position near one end portion thereof in the longitudinal direction and a press operation at a position near the other end portion thereof, the corresponding function is preferably displayed in a vicinity of each of the end portions. For example, each of the functions of the electronic apparatus 1 when a press operation is made on each of the positions of the end portions in the longitudinal direction of the seesaw switch 5 is displayed on a surface of the key 5A or is displayed near the seesaw switch 5 in the display panel 2.

When a press operation is made at a position near an end portion of the seesaw switch 5 in the longitudinal direction, the seesaw switch 5 rocks such that the side on which the press operation is made moves in the direction from the front side toward the back. The seesaw switch 5 according to the first embodiment has a first fulcrum F1 and a second fulcrum F2 as the fulcrum with which the seesaw switch 5 rocks. The first fulcrum F1 is a contacted portion between the case 3D of the front panel 3 and the portion between the end portion coupled to the first hinge 5D and the bent portion 5Ea in the second hinge 5E. The first fulcrum F1 serves as a fulcrum located near the end portions in the longitudinal direction of the rocker 5B. That is, the first fulcrum F1 is provided near each of the end portions in the longitudinal direction of the rocker 5B. The second fulcrum F2 serves as a fulcrum due to a contact of the protrusion 5H of the rocker 5B with the substrate 6, and is located between both of the end portions in the longitudinal direction of the rocker 5B. In other words, the protrusion 5H of the rocker 5B provided as the second fulcrum F2 functions as a fulcrum due to the contact with the substrate 6.

Two first fulcrums F1 are located near both of the end portions in the longitudinal direction of the rocker 5B. At the time of the press operation to the seesaw switch 5, the first fulcrum F1 that functions as the fulcrum is switched in accordance with the position at which the press operation is made. Regarding the first fulcrum F1 and the second fulcrum F2, the fulcrum of the rocker 5B is switched between the first fulcrum F1 and the second fulcrum F2 in accordance with the amount of the press operation at a time of the press operation to the seesaw switch 5.

Rock of the seesaw switch 5 by a press operation will be described. When a press operation Pa is made near one end portion in the longitudinal direction of the seesaw switch 5 (see FIG. 4), first, the rocker 5B together with the key 5A makes a rock Ra (see FIG. 4) with, as the fulcrum, a first fulcrum Fla on the other end portion in the longitudinal direction of the rocker 5B (see FIG. 4). That is, the rocker 5B makes the rock Ra with the first fulcrum Fla as the fulcrum such that the end portion on the side on which the press operation Pa is made in the longitudinal direction moves in the direction toward the back.

A distance between the first fulcrum Fla and the position at which the press operation Pa is made in the longitudinal direction of the rocker 5B is larger than a distance between the position at which the press operation Pa is made and the second fulcrum F2 in the longitudinal direction of the rocker 5B. Thus, an angle of the rock for an amount of the press operation at the time of the rock Ra of the rocker 5B with the first fulcrum Fla as the fulcrum is smaller than an angle of the rock for an amount of the press operation at the time of the rock Ra of the rocker 5B with the second fulcrum F2 as the fulcrum.

Due to the rock Ra of the rocker 5B with the first fulcrum Fla as the fulcrum, the protrusion 5H of the rocker 5B which faces to the substrate 6 comes close to the substrate 6, and the protrusion 5H is then contact with the substrate 6. By continuing the press operation Pa with the protrusion 5H being in contact with the substrate 6, the fulcrum of the rocker 5B in rock switches to the second fulcrum F2 from the first fulcrum F1. That is, the distance between the second fulcrum F2 and the substrate 6 changes in accordance with the amount of the press operation near the opposite end portion to the end portion at which the first fulcrum F1 is located in the rocker 5B, and the rocker 5B rocks with the second fulcrum F2 as the fulcrum with the second fulcrum F2 being in contact with the substrate 6. As above, in accordance with the amount of the press operation to the opposite end portion to the end portion at which the first fulcrum F1 is located in the longitudinal direction of the rocker 5B, the fulcrum of the rocker 5B in rock is switched between the first fulcrum F1 and the second fulcrum F2.

The first fulcrum F1 serves as a fulcrum due to the contact between the case 3D of the front panel 3 and the second hinge 5E, and the second hinge 5E has a flexibility. Thus, the first fulcrum F1 has a flexibility. Therefore, when the rocker 5B rocks with the second fulcrum F2 as the fulcrum, the first fulcrum F1 bends.

For example, in a case where the rocker 5B makes the rock Ra with the second fulcrum F2 as the fulcrum due to the press operation Pa near the one end portion in the longitudinal direction of the seesaw switch 5, the portion on the side on which the other end portion is located in the longitudinal direction of the rocker 5B moves in a direction toward the front side with increasing a distance to the substrate 6. Thus, a force in the direction toward the front side acts on the first fulcrum Fla located on the end portion opposite to the side on which the press operation Pa is made in the longitudinal direction of the seesaw switch 5. However, the second hinge 5E as the first fulcrum Fla is in contact with the case 3D of the front panel 3 from the back side. Thus, the second hinge 5E is regulated by the case 3D for a movement in the direction from the back side to the front side.

Meanwhile, with its flexibility, the second hinge 5E is capable of bending by an external force. Therefore, the entire rocker 5B can rock with the second fulcrum F2 as the fulcrum in a state in which the second hinge 5E is in contact with the case 3D and bent without any change of its position. That is, due to the bend of the first fulcrum Fla located on the end portion opposite to the side on which the press operation Pa is made in the longitudinal direction, the rocker 5B can make the rock Ra with the second fulcrum F2 as the fulcrum.

Due to the rock Ra of the rocker 5B with the second fulcrum F2 as the fulcrum, a portion closer to the end portion on the side on which the press operation Pa is made in the longitudinal direction of the rocker 5B moves in the direction toward the back to have contact with the main switch 6A disposed on the substrate 6 between the rocker 5B and the substrate 6. In this case, the two main switches 6A are disposed in the one seesaw switch 5. In a case where the rocker 5B makes the rock Ra with the second fulcrum F2 as the fulcrum, the rocker 5B has contact with a main switch 6Aa located closer to the end portion on the side on which the press operation Pa is made in the longitudinal direction of the rocker 5B among the two main switches 6A (see FIG. 4).

That is, the main switch 6Aa with which the rocker 5B has contact at the time of the rock Ra of the rocker 5B with the second fulcrum F2 as the fulcrum is the main switch 6A disposed on the end portion opposite to the end portion at which the first fulcrum Fla is located in the rocker 5B among the two main switches 6A. The main switch 6Aa has contact with the rocker 5B due to the rock Ra of the rocker 5B due to the press operation Pa near the one end portion in the longitudinal direction of the seesaw switch 5.

The main switch 6Aa operates in response to contact with the rocker 5B, detects that the press operation Pa has been made near the end portion on the one side in the seesaw switch 5, and notifies a controller (not illustrated) in the electronic apparatus 1 that the press operation Pa has been made near the end portion on the one side of the seesaw switch 5. Thus, the controller controls the electronic apparatus 1 such that the operation allocated to the vicinity of the end portion on the one side of the seesaw switch 5 is performed, that is, the operation corresponding to the press operation Pa near the end portion on the one end of the seesaw switch 5 is performed.

Meanwhile, in a case where the rocker 5B makes the rock Ra with the second fulcrum F2 as the fulcrum, the portion located opposite to the end portion on the side on which the press operation Pa is made in the rocker 5B is regulated in a movement in a direction toward the front by the first fulcrum Fla due to the contact between the case 3D of the front panel 3 and the second hinge 5E. Thus, in a case where the rocker 5B makes the rock Ra with the second fulcrum F2 as the fulcrum, a force occurs in the direction toward the front which separates the rocker 5B from a main switch 6Ab, among the two main switches 6A, located closer to the end portion opposite to the end portion on the side on which the press operation Pa is made in the longitudinal direction of the rocker 5B (see FIG. 4). However, since the first fulcrum Fla bends, the main switch 6Aa is reliably operated with inhibition of a rise in the direction toward the front of the portion located opposite to the end portion on the side on which the press operation Pa is made with respect to the second fulcrum F2 (see FIG. 4).

Similarly to the above, in a case where a press operation Pb is made near the other end portion in the longitudinal direction of the seesaw switch 5 (see FIG. 4), the rocker 5B together with the key 5A makes a rock Rb (see FIG. 4) with, as the fulcrum, a first fulcrum Fib on the one end portion in the longitudinal direction of the rocker 5B (see FIG. 4). That is, the rocker 5B makes the rock Rb with the first fulcrum Fib as the fulcrum such that the end portion on the side on which the press operation Pb is made in the longitudinal direction moves in the direction toward the back.

A distance between the first fulcrum Fib and the position at which the press operation Pb is made in the longitudinal direction of the rocker 5B is larger than a distance between the position at which the press operation Pb is made and the second fulcrum F2 in the longitudinal direction of the rocker 5B. Thus, an angle of the rock for an amount of the press operation at the time of the rock Rb of the rocker 5B with the first fulcrum Fib as the fulcrum is smaller than an angle of rock to an amount of the press operation at the time of the rock Rb of the rocker 5B with the second fulcrum F2 as the fulcrum.

Due to the rock Rb of the rocker 5B with the first fulcrum Fib as the fulcrum, the protrusion 5H of the rocker 5B which faces to the substrate 6 comes close to the substrate 6, and the protrusion 5H has contact with the substrate 6. Thus, the fulcrum of the rocker 5B in rock is switched from the first fulcrum Fib to the second fulcrum F2.

The second hinge 5E on the side on which the first fulcrum Fib is located has a flexibility similarly to the second hinge 5E on the side on which the first fulcrum Fla is located. Thus, when the rocker 5B rocks with the second fulcrum F2 as the fulcrum, the second hinge 5E on the side on which the first fulcrum Fib is located bends with being contact with the case 3D that forms the first fulcrum Fib together with the second hinge 5E. Thus, the entire rocker 5B can rock with the second hinge 5E without any change of its position. That is, due to the bend of the first fulcrum Fib located on the end portion opposite to the side on which the press operation Pb is made in the longitudinal direction, the rocker 5B can make the rock Rb with the second fulcrum F2 as the fulcrum.

Due to the rock Rb of the rocker 5B with the second fulcrum F2 as the fulcrum, a portion closer to the end portion on the side on which the press operation Pb is made in the longitudinal direction of the rocker 5B moves in the direction toward the back. Thus, the rocker 5B has contact with the main switch 6Ab located closer to the end portion on the side on which the press operation Pb is made in the longitudinal direction of the rocker 5B among the two main switches 6A.

That is, the main switch 6Ab with which the rocker 5B has contact at the time of the rock Rb of the rocker 5B with the second fulcrum F2 as the fulcrum is the main switch 6A disposed on the end portion side opposite to the end portion at which the first fulcrum Fib is located in the rocker 5B among the two main switches 6A. The main switch 6Ab has contact with the rocker 5B due to the rock Rb of the rocker 5B due to the press operation Pb near the other end portion in the longitudinal direction of the seesaw switch 5.

The main switch 6Ab operates in response to contact with the rocker 5B, detects that the press operation Pb has been made near the end portion on the other side in the seesaw switch 5, and notifies the controller in the electronic apparatus 1 that the press operation Pb has been made near the end portion on the other side of the seesaw switch 5. Thus, the controller controls the electronic apparatus 1 such that the operation allocated to the vicinity of the end portion on the other side of the seesaw switch 5 is performed, that is, the operation corresponding to the press operation Pb near the end portion on the other side of the seesaw switch 5 is performed.

Meanwhile, in a case where the rocker 5B makes the rock Rb with the second fulcrum F2 as the fulcrum, the portion located opposite to the end portion on the side on which the press operation Pb is made in the rocker 5B is regulated in a movement in a direction toward the front by the first fulcrum Fib due to the contact between the case 3D of the front panel 3 and the second hinge 5E. Thus, in a case where the rocker 5B makes the rock Rb with the second fulcrum F2 as the fulcrum, a force occurs in the direction toward the front which separates the rocker 5B from a main switch 6Aa, among the two main switches 6A, located closer to the end portion opposite to the end portion on the side on which the press operation Pb is made in the longitudinal direction of the rocker 5B (see FIG. 4). However, since the first fulcrum Fib bends, the main switch 6Ab is reliably operated with inhibition of a rise in the direction toward the front of the portion located opposite to the end portion on the side on which the press operation Pb is made with respect to the second fulcrum F2 (see FIG. 4).

As described above, the seesaw switch 5 enables the rocker 5B to have contact with the different main switches 6A corresponding to the press operation Pa near the end portion on the one side in the longitudinal direction and the press operation Pb near the end portion on the other side, so that different input operations can be made based on the pressed positions.

When the operator makes a press operation to the seesaw switch 5 and then releases the finger from the seesaw switch 5, the rocker 5B rocks due to the elasticity of the second hinge 5E such that the vicinity of the end portion of the rocker 5B on the side on which the press is made moves away from the substrate 6. That is, in a case where the press operation Pa is made near the one end portion in the longitudinal direction of the seesaw switch 5 and then the pressing force is released, the entire rocker 5B rocks due to the elasticity of the second hinge 5E forming the first fulcrum Fla on the other end portion such that the vicinity of the end portion of the rocker 5B on the side on which the press operation Pa is made moves away from the substrate 6. Thus, the rocker 5B is spaced apart from the main switch 6Aa, and the protrusion 5H of the rocker 5B as the second fulcrum F2 is spaced apart from the substrate 6.

Similarly, in a case where the press operation Pb is made near the other end portion in the longitudinal direction of the seesaw switch 5 and then the pressing force is released, the entire rocker 5B rocks due to the elasticity of the second hinge 5E forming the first fulcrum Fib on the one end portion such that the vicinity of the end portion of the rocker 5B on the side on which the press operation Pb is made moves away from the substrate 6. Thus, the rocker 5B is spaced apart from the main switch 6Ab, and the protrusion 5H of the rocker 5B as the second fulcrum F2 is spaced apart from the substrate 6. Therefore, in a case where the operator makes a press operation to the seesaw switch 5 and then releases the finger from the seesaw switch 5, the seesaw switch 5 returns to the state before the press operation.

In the seesaw switch 5 and the electronic apparatus 1 according to the first embodiment above, since the fulcrum of the rocker 5B in rock is switched between the first fulcrum F1 and the second fulcrum F2 in accordance with the amount of the press operation to the end portion opposite to the end portion at which the first fulcrum F1 is located in the longitudinal direction of the rocker 5B, the rocker 5B can change in rock manner during the press operation. That is, the angle of the rock for the amount of the press operation can be reduced in a range in which the rocker 5B rocks with the first fulcrum F1 as the fulcrum, so that the appearance can be inhibited from being unattractive at the time of the rock of the seesaw switch 5, for example, due to an increase of a gap between the seesaw switch 5 and the front panel 3.

In a range in which the rocker 5B rocks with the second fulcrum F2 as the fulcrum, a rise of the end portion opposite to the end portion on which the press operation is made in the longitudinal direction of the rocker 5B can be inhibited. Thus, at the time of the press operation to the seesaw switch 5, the appearance can be inhibited from being unattractive due to a rise of the key 5A of the seesaw switch 5, with inhibition of the rocker 5B from having contact with the main switch 6A different from the main switch 6A corresponding to the press operation. As a result, both securement of a beautiful appearance and easiness for manufacturing can be achieved.

The distance between the protrusion 5H of the rocker 5B and the substrate 6 changes in accordance with the amount of the press operation to the rocker 5B. When the protrusion 5H of the rocker 5B has contact with the substrate 6, the second fulcrum F2 functions as the fulcrum of the rocker 5B in rock. Thus, the fulcrum of the rocker 5B at the time of the rock can be easily switched between the first fulcrum F1 and the second fulcrum F2 in accordance with the amount of the press operation to the rocker 5B. As a result, both securement of a beautiful appearance and easiness for manufacturing can be achieved.

Since the first fulcrum F1 has a flexibility, the first fulcrum F1 bends when the rocker 5B rocks with the second fulcrum F2 as the fulcrum. Thus, when rocking with the second fulcrum F2 as the fulcrum, the rocker 5B can rock more reliably. Thus, the fulcrum of the rocker 5B at the time of the rock can be switched more reliably between the first fulcrum F1 and the second fulcrum F2. As a result, both securement of a beautiful appearance and easiness for manufacturing can be achieved.

Since the first fulcrum F1 is provided at each of the end portions in the longitudinal direction of the rocker 5B, even in a case where the press operation is made at a position closer to either of the end portions in the longitudinal direction of the seesaw switch 5, the rocker 5B can rock with a switch between the first fulcrum F1 and the second fulcrum F2 based on the amount of the press operation. As a result, both securement of a beautiful appearance and easiness for manufacturing can be achieved.

Second Embodiment

A seesaw switch 5 according to a second embodiment is substantially similar in configuration to the seesaw switch 5 according to the first embodiment, but has a feature that a sub-switch 6B is provided in addition to the main switch 6A as a tactile switch with which a rocker 5B comes in contact. The other constituents similar to those in the first embodiment are denoted with the same reference signs, and thus the descriptions thereof will be omitted.

Figure 5:
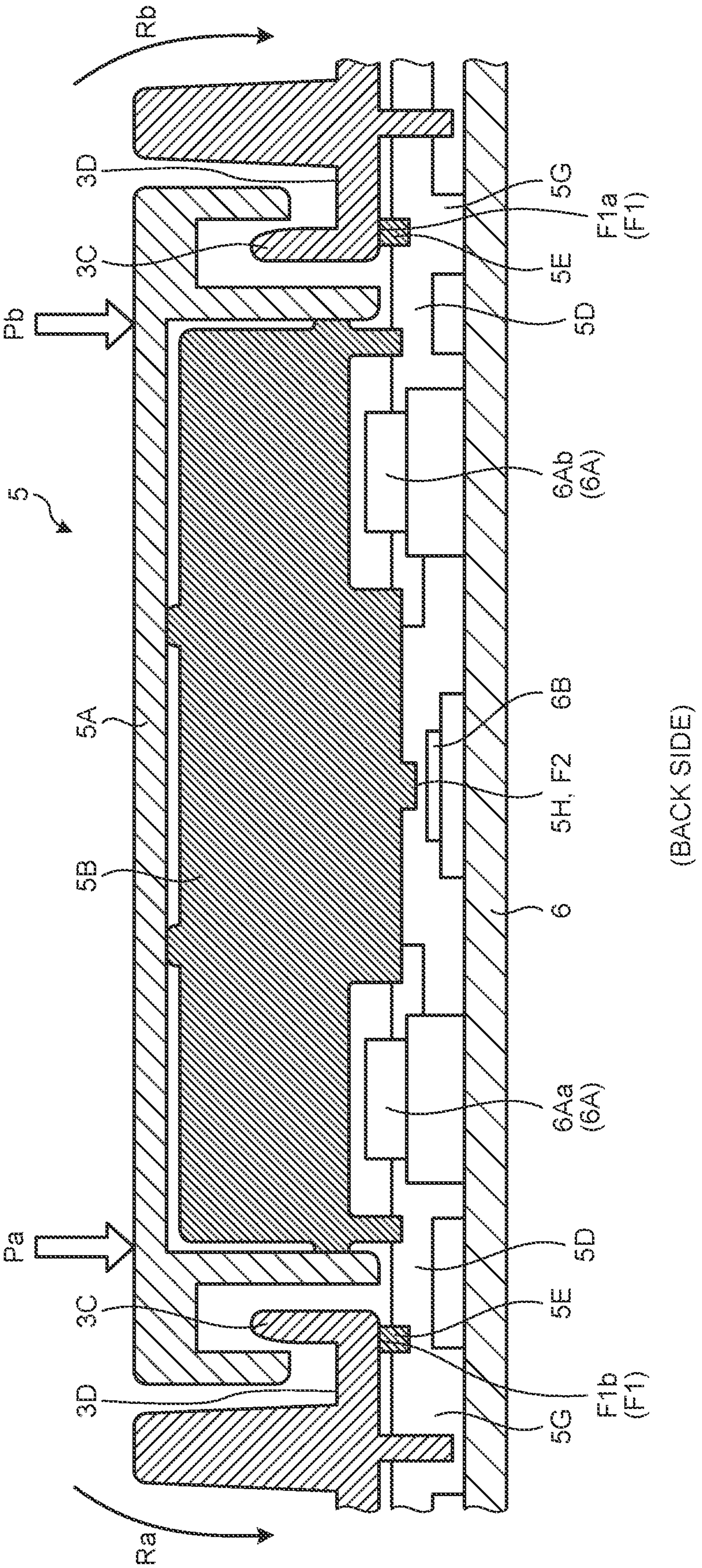
FIG. 5 is a sectional view of a seesaw switch according to a second embodiment.

FIG. 5 is a sectional view of the seesaw switch 5 according to the second embodiment. The seesaw switch 5 according to the second embodiment has a first fulcrum F1 and a second fulcrum F2, similarly to the seesaw switch 5 according to the first embodiment, in which the fulcrum of the rocker 5B in rock is switched between the first fulcrum F1 and the second fulcrum F2 in accordance with the amount of the press operation to the end portion opposite to the end portion at which the first fulcrum F1 is located in the longitudinal direction of the rocker 5B. Furthermore, the seesaw switch 5 according to the second embodiment has the sub-switch 6B disposed at a position which faces to the second fulcrum F2.

Particularly, the sub-switch 6B is provided as a tactile switch, similarly to the main switch 6A. The sub-switch 6B is implemented at a position between the two main switches 6A on the substrate 6. That is, the sub-switch 6B is implemented at a position faces to a protrusion 5H of the rocker 5B. In other words, the protrusion 5H of the rocker 5B is located at a position faces to the sub-switch 6B disposed on the substrate 6 in a state in which the connection 5G is in contact with the substrate 6 and the rocker 5B is disposed on the front side of the substrate 6. When no press operation is made to the seesaw switch 5, the protrusion 5H of the rocker 5B is spaced apart from the sub-switch 6B. Due to contact with the sub-switch 6B, the protrusion 5H provided as the second fulcrum F2 functions as the fulcrum.

The rocker 5B disposed on the back side of the key 5A enables the main switch 6A and the sub-switch 6B to operate in a case where the key 5A is pressed toward the back side by an operator. That is, due to the rock of the rocker 5B when the key 5A is pressed toward the back side by the operator, a portion of the rocker 5B comes close to the substrate 6 and then has contact with the main switch 6A or the sub-switch 6B, and the rocker 5B enables the main switch 6A or the sub-switch 6B to operate.

Since the sub-switch 6B is disposed at the position between the two main switches 6A, in other words, the two main switches 6A implemented on the substrate 6 are disposed on both sides of the sub-switch 6B. Particularly, with the rocker 5B being disposed on the front side of the substrate 6, the two main switches 6A are disposed on both sides of the sub-switch 6B in the longitudinal direction of the rocker 5B. Thus, the two main switches 6A are disposed at positions on both sides of the protrusion 5H in the longitudinal direction of the rocker 5B and face to the rocker 5B at the positions on both sides of the protrusion 5H. The main switches 6A are spaced apart from the rocker 5B when no press operation is made to the seesaw switch 5.

In the seesaw switch 5 according to the second embodiment with the sub-switch 6B, each of the main switches 6A functions in cooperation with the sub-switch 6B. Specifically, the sub-switch 6B is used as a tactile switch that functions at the time of a first stroke with a relatively small amount of the press operation to the seesaw switch 5, and each of the main switches 6A is used as a tactile switch that functions at the time of a second stroke larger in the amount of the press operation to the seesaw switch 5 than the first stroke. The first stroke in this case has an amount of the press operation that causes the rocker 5B to have contact with the sub-switch 6B but no contact with the main switches 6A at the time of the press operation to the seesaw switch 5, and the second stroke has an amount of the press operation that causes the rocker 5B to have contact with both the sub-switch 6B and the main switch 6A. The main switch 6A is pressed with the sub-switch 6B pressed to function in cooperation with the sub-switch 6B.

Next, the operation of the seesaw switch 5 according to the second embodiment will be described. In a case where a press operation Pa is made to the seesaw switch 5, for example, near one end portion in the longitudinal direction of the seesaw switch 5, the rocker 5B together with the key 5A makes a rock Ra with, as the fulcrum, a first fulcrum Fla on the other end portion in the longitudinal direction of the rocker 5B. That is, the rocker 5B makes the rock Ra with the first fulcrum Fla as the fulcrum such that the end portion on the side on which the press operation Pa is made in the longitudinal direction moves in the direction toward the back.

Due to the rock Ra of the rocker 5B with the first fulcrum Fla as the fulcrum, the protrusion 5H of the rocker 5B comes close to the sub-switch 6B which faces to the protrusion 5H, and then the protrusion 5H has contact with the sub-switch 6B. That is, when the amount of the press operation of the press operation Pa to the seesaw switch 5 reaches the first stroke, the protrusion 5H has contact with the sub-switch 6B.

Thus, the sub-switch 6B detects that the amount of the press operation of the press operation Pa to the seesaw switch 5 has reached the first stroke, and notifies the controller in the electronic apparatus 1 that the press operation has been made with the amount of the press operation of the first stroke. The controller controls the electronic apparatus 1 such that a predetermined set operation as the operation that is performed when the amount of the press operation to the seesaw switch 5 reaches the first stroke is performed. As described above, the sub-switch 6B is operated by the rock of the rocker 5B with the first fulcrum F1 as the fulcrum.

Due to the contact of the protrusion 5H with the sub-switch 6B after the amount of the press operation to the seesaw switch 5 reaches the first stroke, the fulcrum of the rocker 5B in rock is switched from the first fulcrum Fla to the second fulcrum F2. The second fulcrum F2 in this case serves as a fulcrum due to the contact of the protrusion 5H of the rocker 5B with the sub-switch 6B. That is, the distance between the second fulcrum F2 and the sub-switch 6B changes in accordance with the amount of the press operation at the time of the press operation near the opposite end portion to the end portion at which the first fulcrum F1 is located in the rocker 5B, and the rocker 5B rocks with the second fulcrum F2 as the fulcrum with the second fulcrum F2 being in contact with the sub-switch 6B. As described above, in accordance with the amount of the press operation to the opposite end portion to the end portion at which the first fulcrum F1 is located in the longitudinal direction of the rocker 5B, the fulcrum of the rocker 5B in rock is switched between the first fulcrum F1 and the second fulcrum F2.

By continuing the press operation Pa near the one end portion of the seesaw switch 5 in a state in which the fulcrum of the rocker 5B in rock is switched from the first fulcrum Fla to the second fulcrum F2, the rocker 5B has contact with the main switch 6Aa located closer to the end portion on the side on which the press operation Pa is made in the longitudinal direction of the rocker 5B. That is, when the amount of the press operation of the press operation Pa to the seesaw switch 5 reaches the second stroke, the rocker 5B has contact with the main switch 6Aa.

Thus, the main switch 6Aa detects that the amount of the press operation of the press operation Pa to the seesaw switch 5 has reached the second stroke, and notifies the controller in the electronic apparatus 1 that the press operation Pa has been made with the amount of the press operation of the second stroke. The controller controls the electronic apparatus 1 such that a predetermined set operation as the operation that is performed when the amount of the press operation reaches the second stroke when the press operation Pa is made near the one end portion in the longitudinal direction of the seesaw switch 5 is performed. As described above, the main switch 6A is operated by the rock of the rocker 5B with the second fulcrum F2 as the fulcrum.

Similarly, in a case in which the press operation Pb is made near the other end portion in the longitudinal direction of the seesaw switch 5, the rocker 5B together with the key 5A makes a rock Rb with, as the fulcrum, a first fulcrum Fib on the one end portion in the longitudinal direction of the rocker 5B. Due to the rock Rb of the rocker 5B with the first fulcrum Fib as the fulcrum, the protrusion 5H of the rocker 5B which faces to the sub-switch 6B comes close to the sub-switch 6B, and then the protrusion 5H has contact with the sub-switch 6B. Thus, the sub-switch 6B detects that the amount of the press operation of the press operation Pb to the seesaw switch 5 has reached the first stroke, and notifies the controller thereof. The controller controls the electronic apparatus 1 such that a predetermined set operation as the operation that is performed when the amount of the press operation to the seesaw switch 5 reaches the first stroke is performed.

Due to the contact of the protrusion 5H with the sub-switch 6B after the amount of the press operation to the seesaw switch 5 reaches the first stroke, the fulcrum of the rocker 5B in rock is switched from the first fulcrum Fib to the second fulcrum F2. When the amount of the press operation of the press operation Pa to the seesaw switch 5 reaches the second stroke by continuing the press operation Pb in a state in which the fulcrum of the rocker 5B in rock is switched from the first fulcrum Fib to the second fulcrum F2, the rocker 5B has contact with the main switch 6Aa located closer to the end portion on the side on which the press operation Pa is made in the longitudinal direction of the rocker 5B.

Thus, the main switch 6Ab operates due to the contact with the rocker 5B, detects that the amount of the press operation of the press operation Pb near the end portion on the other side in the seesaw switch 5 has reached the second stroke, and notifies the controller in the electronic apparatus 1 that the press operation Pb has been made with the amount of the press operation of the second stroke near the end portion on the other side of the seesaw switch 5. The controller controls the electronic apparatus 1 such that a predetermined set operation as the operation that is performed when the amount of the press operation reaches the second stroke when the press operation Pb is made near the one end portion in the longitudinal direction of the seesaw switch 5 is performed.

When the operator makes a press operation to the seesaw switch 5 and then releases the finger from the seesaw switch 5, the rocker 5B rocks due to the elasticity of the second hinge 5E such that the vicinity of the end portion of the rocker 5B on the side on which the press is made moves away from the substrate 6. That is, in a case in which the press operation Pa is made near the one end portion in the longitudinal direction of the seesaw switch 5 and then the pressing force is released, the entire rocker 5B rocks such that the vicinity of the end portion on the side on which the press operation Pa is made moves away from the substrate 6. Thus, the rocker 5B is spaced apart from the main switch 6Aa, and the protrusion 5H of the rocker 5B as the second fulcrum F2 is spaced apart from the sub-switch 6B.

Similarly, in a case in which the press operation Pb is made near the other end portion in the longitudinal direction of the seesaw switch 5 and then the pressing force is released, the entire rocker 5B rocks such that the vicinity of the end portion on the side on which the press operation Pb is made moves away from the substrate 6. Thus, the rocker 5B is spaced apart from the main switch 6Ab, and the protrusion 5H of the rocker 5B as the second fulcrum F2 is spaced apart from the sub-switch 6B. Therefore, when the operator makes the press operation to the seesaw switch 5 and then releases the finger from the seesaw switch 5, the seesaw switch 5 returns to the state before the press operation.

In the second embodiment, since each of the main switches 6A detects the contact with the rocker 5B in a state in which the protrusion 5H is in contact with the sub-switch 6B, each of the main switches 6A functions in cooperation with the sub-switch 6B. Thus, for example, in a case in which the seesaw switch 5 is used as a switch for a playback of a content such as a video by the electronic apparatus 1, functions linked between the first stroke and the second stroke can be set, such as a start or a stop of the playback of the content due to the first stroke and a fast playback or a reverse playback of the content due to the second stroke.

In this case, in response to a short-time press operation with the first stroke, the sub-switch 6B performs the function allocated to the sub-switch 6B independently. In response to a long-time press operation with the second stroke, the sub-switch 6B functions in cooperation with the main switch 6A, and thus the function allocated to the sub-switch 6B is not independently performed. That is, the sub-switch 6B changes in aspect of execution of the allocated function between a short-time operation such as one push operation to the seesaw switch 5 and a long-time operation such as a pressing and holding operation to the seesaw switch 5. In a case in which a long-time operation to the sub-switch 6B is detected, the function allocated to the sub-switch 6B is not independently performed.

In the seesaw switch 5 and the electronic apparatus 1 according to the second embodiment described above, the fulcrum of the rocker 5B in rock is switched between the first fulcrum F1 and the second fulcrum F2 in accordance with the amount of the press operation to the rocker 5B and additionally the sub-switch 6B is disposed at the position which faces to the second fulcrum F2, so that the one rocker 5B can operate the two main switches 6A and the sub-switch 6B. Thus, three functions or more can be set to the seesaw switch 5, and the seesaw switch 5 can be highly functionalized. Therefore, multiple input operations can be easily made without an increase in the number of members, such as buttons 4 and seesaw switches 5, for input operations to the electronic apparatus 1. As a result, an improvement can be made in operability for multiple types of input operations.

Setting three functions or more to the seesaw switch 5 enables a reduction in the number of members for input operations, such as buttons 4 and seesaw switches 5, for the number of types of input operations. As a result, downsizing of the apparatus can be achieved.

The sub-switch 6B is operated by the rock of the rocker 5B with the first fulcrum F1 as the fulcrum, and each of the main switches 6A is operated by the rock of the rocker 5B with the second fulcrum F2 as the fulcrum. Thus, a series of a press operation to the seesaw switch 5 enables a switching between the operation of the sub-switch 6B and the operation of the corresponding main switch 6A. As a result, an improvement can be made more reliably in operability for multiple types of input operations.

The distance between the protrusion 5H of the rocker 5B and the sub-switch 6B changes in accordance with the amount of the press operation to the rocker 5B. Due to the contact of the protrusion 5H of the rocker 5B with the sub-switch 6B, the second fulcrum F2 functions as the fulcrum of the rocker 5B in rock. Thus, the fulcrum of the rocker 5B at the time of the rock can be easily switched between the first fulcrum F1 and the second fulcrum F2 in accordance with the amount of the press operation to the rocker 5B. In addition, in response to the contact of the protrusion 5H with the sub-switch 6B, the sub-switch 6B can be operated. As a result, an improvement can be made more reliably in operability for multiple types of input operations.

Since the first fulcrum F1 has a flexibility, the first fulcrum F1 bends when the rocker 5B rocks with the second fulcrum F2 as the fulcrum. Thus, when rocking with the second fulcrum F2 as the fulcrum, the rocker 5B can rock more reliably. Thus, the fulcrum of the rocker 5B at the time of the rock can be switched more reliably between the first fulcrum F1 and the second fulcrum F2, and both the main switch 6A and the sub-switch 6B can be operated by the rock of the rocker 5B. As a result, an improvement can be made more reliably in operability for multiple types of input operations.

Since the first fulcrum F1 is provided at each of the end portions in the longitudinal direction of the rocker 5B, even in a case in which the press operation is made at a position closer to either of the end portions in the longitudinal direction of the seesaw switch 5, the rocker 5B can rock with a switch between the first fulcrum F1 and the second fulcrum F2 in accordance with the amount of the press operation. Thus, the two main switches 6A and the sub-switch 6B can be operated more reliably by the rock of the one rocker 5B. As a result, an improvement can be made more reliably in operability for multiple types of input operations.

Since each of the main switches 6A cooperates with the sub-switch 6B, multiple linked functions can be set to the seesaw switch 5. Thus, the one seesaw switch 5 enables multiple linked input operations. As a result, an improvement can be made more reliably in operability for multiple types of input operations.

Since an aspect of execution of the function allocated to the sub-switch 6B varies between a short-time operation and a long-time operation as the operation to the sub-switch 6B, malfunction can be inhibited at the operation to the seesaw switch 5 which enables multiple types of the input operations. For example, in a case in which the functions are allocated to the main switches 6A and the sub-switch 6B such that a start or a stop of the playback of the content is performed due to the first stroke to the seesaw switch 5 and a fast playback or a reverse playback of the content is performed due to the second stroke to the seesaw switch 5, when the operation to the sub-switch 6B is detected at the time of the operation with the second stroke during the playback of the content, it is likely to be recognized that an operation for the stop of the content has been made. In contrast to this, in the present embodiment, in a case in which the long-time operation is made to the sub-switch 6B, it is not recognized that the operation of the stop of the content has been made, that is, the function allocated to the sub-switch 6B is not performed. Thus, malfunction can be inhibited at the operation to the seesaw switch 5. As a result, an improvement can be made more reliably in operability for multiple types of input operations.

Modifications Note that, in the first and second embodiments described above, the first fulcrum F1 is provided near each of the end portions in the longitudinal direction of the rocker 5B. However, one first fulcrum F1 may be provided. That is, in the first and second embodiments described above, two first fulcrums F1 are provided in one seesaw switch 5, and two main switches 6A are provided in the one seesaw switch 5. However, one first fulcrum F1 may be provided, and one main switch 6A may be provided. Even in a case in which one first fulcrum F1 and one main switch 6A are provided, the main switch 6A is provided to be disposed on the end portion opposite to the end portion at which the first fulcrum F1 is located in the longitudinal direction of the rocker 5B. Due to the rock of the rocker 5B with the press operation to the seesaw switch 5, the rocker 5B can have contact with the main switch 6A. As described above, the first fulcrum F1 may be located at least at one end portion in the longitudinal direction of the rocker 5B.

A seesaw switch and an electronic apparatus according to the present application can be used in, for example, a display apparatus.

A seesaw switch and an electronic apparatus according to the present application enable, as a first effect, both securement of a beautiful appearance and easiness for manufacturing, and enable, as a second effect, an improvement in operability for multiple types of input operations.

Although the application has been described with respect to specific embodiments for a complete and clear application, the appended claims are not to be thus limited but are to be construed as embodying all modifications and alternative constructions that may occur to one skilled in the art that fairly fall within the basic teaching herein set forth.

What is claimed is:

1. A seesaw switch comprising:

a rocker configured to rock by a press operation;

a first fulcrum located at least at one end portion in a longitudinal direction of the rocker;

a second fulcrum located between the one end portion and another end portion opposite to the one end portion in the longitudinal direction of the rocker; and a main switch disposed on the another end portion opposite to the one end portion at which the first fulcrum is located in the rocker and configured to have contact with the rocker due to rock of the rocker by the press operation, wherein a distance between the second fulcrum and a substrate on which the rocker is disposed changes in accordance with the amount of the press operation to the another end portion opposite to the one end portion at which the first fulcrum is located in the rocker, a fulcrum of the rocker in the rock is switched between the first fulcrum and the second fulcrum in accordance with an amount of the press operation to the another end portion opposite to the one end portion at which the first fulcrum is located in the longitudinal direction of the rocker, and the rocker is further configured to rock with the second fulcrum as the fulcrum in a state in which the second fulcrum is in contact with the substrate.

2. The seesaw switch according to claim 1, wherein the first fulcrum has a flexibility, and the first fulcrum bends when the rocker rocks with the second fulcrum as the fulcrum.

3. The seesaw switch according to claim 1, wherein the first fulcrum is provided at both of the one end portion and the another end portion in the longitudinal direction of the rocker.

4. An electronic apparatus comprising:

a display panel with a display screen on a front face thereof;

a front panel surrounding a circumference of the display panel; and the seesaw switch according to claim 1 which is surrounded by the front panel.

5. A seesaw switch comprising:

a rocker configured to rock by a press operation;

a first fulcrum located at least at one end portion in a longitudinal direction of the rocker;

a second fulcrum located between the one end portion and another end portion opposite to the one end portion in the longitudinal direction of the rocker;

a main switch disposed on the another end portion opposite to the one end portion at which the first fulcrum is located in the rocker and configured to have contact with the rocker due to rock of the rocker by the press operation; and a sub-switch disposed at a position which faces to the second fulcrum, wherein a fulcrum of the rocker in the rock is switched between the first fulcrum and the second fulcrum in accordance with an amount of the press operation to the another end portion opposite to the one end portion at which the first fulcrum is located in the longitudinal direction of the rocker.

6. The seesaw switch according to claim 5, wherein the sub-switch is operated by the rock of the rocker with the first fulcrum as the fulcrum, and the main switch is operated by the rock of the rocker with the second fulcrum as the fulcrum.

7. The seesaw switch according to claim 6, wherein a distance between the second fulcrum and the sub-switch changes in accordance with the amount of the press operation to the another end portion opposite to the one end portion at which the first fulcrum is located in the rocker, and the rocker is further configured to rock with the second fulcrum as the fulcrum in a state in which the second fulcrum is in contact with the sub-switch.

8. The seesaw switch according to claim 5, wherein the main switch is further configured to cooperate with the sub-switch.

* * * * *